(12) United States Patent
Su et al.

(10) Patent No.: US 8,013,676 B2
(45) Date of Patent: Sep. 6, 2011

(54) HIGH-EFFICIENCY POWER AMPLIFIER

(75) Inventors: Yongge Su, Shenzhen (CN); Siqing Ye, Shenzhen (CN); Dandong He, Shenzhen (CN); Weimin Yin, Shenzhen (CN); Xikun Zhang, Shenzhen (CN); Xiaolun Wang, Shenzhen (CN); Qianhua Wei, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 12/816,726

(22) Filed: Jun. 16, 2010

(65) Prior Publication Data

US 2010/0253426 A1    Oct. 7, 2010

Related U.S. Application Data

(63) Continuation of application No. PCT/CN2008/073510, filed on Dec. 15, 2008.

(30) Foreign Application Priority Data

Dec. 17, 2007   (CN) .......................... 2007 1 0179732

(51) Int. Cl.
*H03F 1/26* (2006.01)
(52) U.S. Cl. ............. 330/149; 330/310; 330/98; 330/99
(58) Field of Classification Search .................. 330/149, 330/310, 98, 99
See application file for complete search history.

(56) References Cited

U.S. PATENT DOCUMENTS

| | | | | |
|---|---|---|---|---|
| 4,467,288 A | * | 8/1984 | Strickland | 330/149 |
| 5,991,740 A | | 11/1999 | Messer | |
| 6,614,854 B1 | * | 9/2003 | Chow et al. | 375/297 |
| 7,113,036 B2 | * | 9/2006 | Moffatt et al. | 330/149 |
| 7,142,615 B2 | * | 11/2006 | Hongo et al. | 375/297 |
| 7,602,240 B2 | * | 10/2009 | Gao et al. | 330/98 |
| 7,672,648 B1 | * | 3/2010 | Groe et al. | 455/127.2 |
| 7,826,625 B2 | * | 11/2010 | Lashkari | 381/96 |

(Continued)

FOREIGN PATENT DOCUMENTS

CN          1221253 A       6/1999

(Continued)

OTHER PUBLICATIONS

International Search Report, Application No. PCT/CN2008/073510, Date of mailing Mar. 5, 2009, 4 pages.

(Continued)

*Primary Examiner* — Patricia Nguyen
(74) *Attorney, Agent, or Firm* — Slater & Matsil, L.L.P.

(57) ABSTRACT

A high-efficiency power amplifier is provided, including a drive amplifier and a final power amplifier, and further including a first digital pre-distortion (DPD) correction module and a second DPD correction module. The first DPD correction module is configured to pre-distort nonlinear characteristics of drive signals output by the drive amplifier, and the second DPD correction module is connected to the first DPD correction module in series, and is configured to pre-distort nonlinear characteristics of amplified signals output by the final power amplifier. Another high-efficiency power amplifier is also provided, including a drive amplifier and a final power amplifier, and further including a second multi-path control module, a fourth DPD correction module, and a second gating module. The overall efficiency of the high-efficiency power amplifier is increased by improving the working efficiency of the drive amplifier. Further, higher overall efficiency is also achieved for a power amplifier with a higher gain.

15 Claims, 4 Drawing Sheets

U.S. PATENT DOCUMENTS

| | | |
|---|---|---|
| 2002/0016154 A1 | 2/2002 | Huttunen |
| 2005/0195919 A1 | 9/2005 | Cova |
| 2007/0229180 A1 | 10/2007 | Shimizu et al. |
| 2009/0108952 A1 | 4/2009 | Shimizu et al. |

FOREIGN PATENT DOCUMENTS

| | | |
|---|---|---|
| CN | 1330808 A | 1/2002 |
| CN | 101015121 A | 8/2007 |
| CN | 101207366 A | 6/2008 |
| CN | 100578922 C | 1/2010 |
| EP | 0 899 870 A1 | 3/1999 |
| JP | 2001-060883 A | 3/2001 |
| JP | 2005-033490 A | 2/2005 |
| WO | WO 99/57806 A1 | 11/1999 |
| WO | WO 2009/082922 A1 | 7/2009 |

OTHER PUBLICATIONS

International Preliminary Report on Patentability, Application No. PCT/CN2008/073510, Date of issuance Jun. 22, 2010, 5 pages.

* cited by examiner

HIGH-EFFICIENCY POWER AMPLIFIER

This application is a continuation of co-pending International Application No. PCT/CN2008/073510, filed Dec. 15, 2008, which designated the United States and was not published in English, and which claims priority to Chinese Application No. 200710179732.1 filed Dec. 17, 2007, both of which applications are incorporated herein by reference.

TECHNICAL FIELD

The present invention relates to the field of electronic communication technology, and more particularly to a high-efficiency power amplifier and method.

BACKGROUND

Radio frequency (RF) and microwave power amplifiers are used in communication systems to amplify RF and microwave modulated signals that carry information, respectively. In order to improve the utilization efficiency of a frequency spectrum, modulated signals of many standards, for example, the Code-Division Multiple Access (CDMA) and Orthogonal Frequency Division Multiplexing (OFDM) technologies, carry phase and amplitude information simultaneously. Information of these types of signals is modulated on both dimensions of amplitude and phase, so these types of signals are amplified by using a linear amplifier to ensure a small distortion generated in amplitude and phase. However, since it is inherently nonlinear, the power amplifier is bound to bring distortion of amplitude and phase to some extent. One method to address this problem is to enable the power amplifier to work in a quasi-linear state of a Class A or Class AB amplifier. By using an amplifier with large power to output small power (that is, the method of power back-off), the distortion of amplitude and phase caused by the power amplifier during the signal transmission is reduced. This method may ensure the linearity of the power amplifier, making it meet the requirements for the spectrum mask and the adjacent channel leakage ratio in the protocol. However, this method results in reduction in the efficiency of the power amplifier and increase in power consumption. If power consumption increases, bulky radiators and fans and other radiating devices will be needed, and thus product miniaturization will be difficult, cost of the system will increase, and reliability will be significantly reduced. Therefore, currently, various linearization technologies are proposed for eliminating nonlinearity of the power amplifier, so as to reduce the amount of back-off and improve the efficiency of the power amplifier. With the development of the digital signal processing technology, a solution applied widely now is as follows: using high-efficiency power amplifiers with a strong nonlinearity, such as a Class C, Class D, Class E, and Class F power amplifier, and applying the pre-distortion linearization technology where a nonlinear circuit is added in front of the power amplifier to compensate for the nonlinear distortion of the power amplifier, so as to improve the efficiency of the power amplifier as far as possible while the linear output is ensured. The advantages of the pre-distortion linearization technology lie in its stability, broader signal band, capability of processing signals that containing multi-carriers, and low cost.

Pre-distortion may be divided into two basic types: RF pre-distortion and digital pre-distortion (DPD). RF pre-distortion is commonly implemented by using an analog circuit, which has the advantages of simple circuit structure, low cost, and being easy to implement high frequency and broadband applications. However, the RF pre-distortion has the following disadvantages: limited improvement to the spectral regrowth component, and difficulty in eliminating high-order spectral components. Because of its low working frequency, the DPD may be implemented with a digital circuit, which is well adaptable. In addition, the high-order intermodulation distortion may be eliminated by increasing the sampling frequency and quantization order number in the DPD, so the DPD is quite a promising method. The DPD technology includes the table lookup method, polynomial method, neural network method and various other pre-distortion methods, in which the table lookup method is relatively simple, and is quite flexible in algorithm, making it a method used widely in the DPD technology.

The linear amplification of amplitude and phase of signals may be implemented by using a high-efficiency power amplifier with strong nonlinearity plus the DPD technology, for example, a Doherty power amplifier combined with the DPD, an Envelope Tracking (ET) power amplifier combined with the DPD, or an Envelope Elimination and Restoration (EER) power amplifier combined with the DPD. This kind of combination technology is commonly applied in the final power amplifier, that is, the final stage power amplifier to improve the efficiency of the final stage. While in the drive stage, a Class A or Class AB power amplifier for power back-off is applied, making it difficult to further improve the efficiency. If Doherty, ET, EER or other high-efficiency power amplifier technologies are used in the drive amplifier, the distortion of phase and amplitude of the drive amplifier and the distortion of phase and amplitude of the final power amplifier will result in a larger distortion amplitude, broader distortion bandwidth and increased memory effect of the final power amplifier's output, and difficulty in hardware design and DPD correction algorithm.

SUMMARY OF THE INVENTION

Embodiments of the present invention are directed to a high-efficiency power amplifier, which improves overall efficiency of the power amplifier by improving the efficiency of a drive amplifier and linearity of an output signal.

One aspect of the present invention provides a high-efficiency power amplifier, which includes a drive amplifier and a final power amplifier, and further includes a first DPD correction module and a second DPD correction module.

The first DPD correction module is configured to pre-distort nonlinear characteristics of a drive signal output by the drive amplifier, output a first signal having nonlinear characteristics contrary to the nonlinear characteristics of the drive signal, and correct the nonlinear characteristics of the drive signal. The drive signal is output by the drive amplifier for driving the final power amplifier.

The second DPD correction module is connected to the first DPD correction module in series, and is configured to pre-distort nonlinear characteristics of an amplified signal output by the final power amplifier, output a second signal having nonlinear characteristics contrary to the nonlinear characteristics of the amplified signal, and correct the nonlinear characteristics of the amplified signal.

Another aspect of the present invention further provides a high-efficiency power amplifier, which includes a drive amplifier and a final power amplifier, and further includes a second multi-path control module, a fourth DPD correction module, and a second gating module.

The second multi-path control module is configured to receive multiple signals to be gated, at least including a drive signal with nonlinear characteristics output by the drive amplifier and an amplified signal with nonlinear characteristics output by the final power amplifier, and gate one of the drive signal and the amplified signal to output.

The fourth DPD correction module is configured to at least pre-distort the nonlinear characteristics of the one of the drive signal and the amplified signal, output a signal with nonlinear characteristics contrary to the nonlinear characteristics of the one of the drive signal and the amplified signal respectively, and correct the nonlinear characteristics of the one of the drive signal and the amplified signal respectively.

The second gating module is configured to control the multiple signals to be gated by the second multi-path control module, and enable the second multi-path control module at least gate the drive signal or the amplified signal into the fourth DPD correction module. The second gating module is connected to the fourth DPD correction module and the second multi-path control module, and is controlled by the fourth DPD correction module.

Through the above technical solutions, in the high-efficiency power amplifier according to the embodiments of the present invention, the overall efficiency of the high-efficiency power amplifier is increased by improving the working efficiency of the drive amplifier. As such, a high-efficiency power amplifier with a low gain becomes more practical. If the technical solutions are used in a power amplifier with a high gain, the overall efficiency may also be further improved.

The present invention is hereinafter described in detail with reference to the specific embodiments and the accompanying drawings.

DETAILED DESCRIPTION OF ILLUSTRATIVE EMBODIMENTS

In the high-efficiency power amplifiers in the embodiments of the present invention, a high-efficiency drive amplifier is adopted in the design of the high-efficiency power amplifier to increase the efficiency of the drive amplifier. However, the high-efficiency drive amplifier will cause a nonlinear effect, and after cascade connection to the final power amplifier, it may bring insurmountable difficulties to the common DPD correction. Therefore, multiple feedback points and multiple DPD correction loops are adopted in the embodiments of the present invention to correct the drive amplifier individually.

Figure 1:
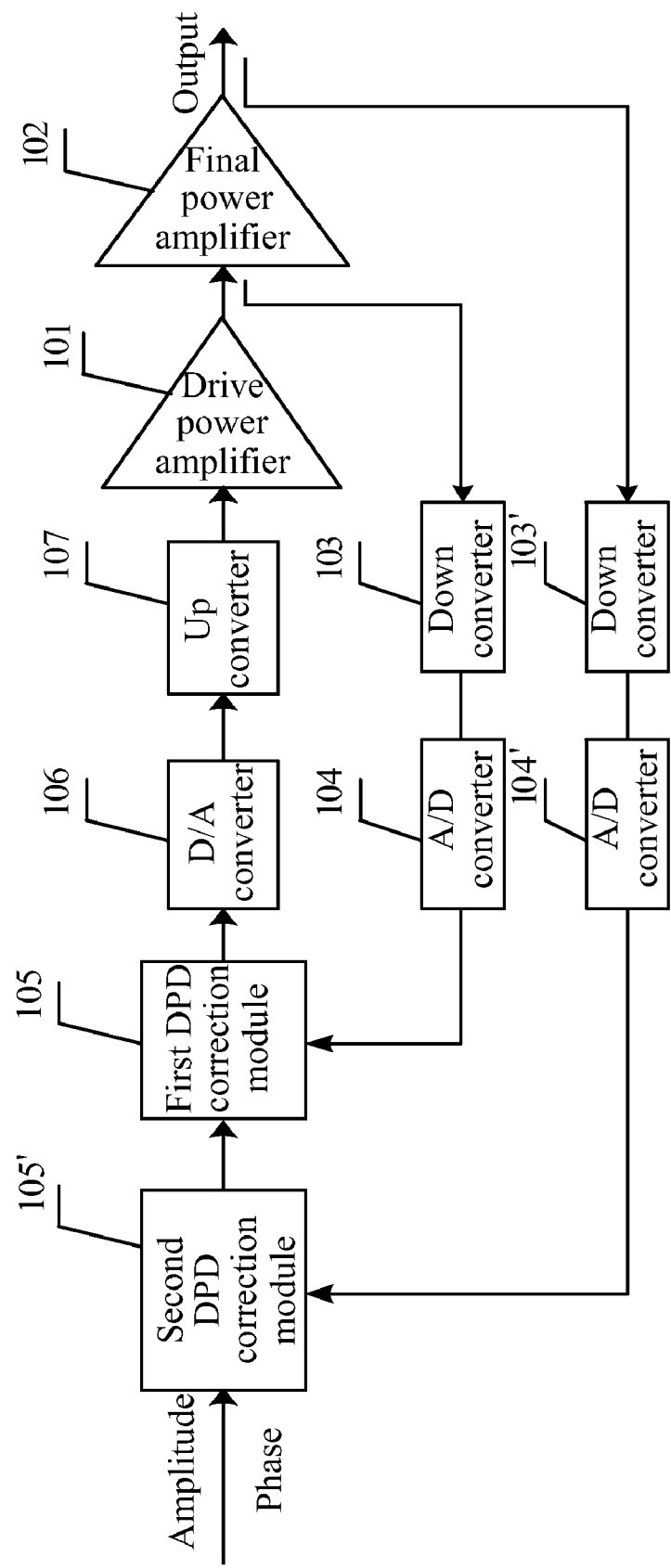
FIG. 1 is a simple schematic structural view of a high-efficiency power amplifier according to one embodiment of the present invention.

FIG. 1 is a simple schematic structural view of a high-efficiency power amplifier according to one embodiment of the present invention. As shown in FIG. 1, the high-efficiency power amplifier includes a drive power amplifier 101, which is a high-efficiency drive amplifier, so as to improve the efficiency of the drive stage, so that the overall efficiency of the power amplifier may be increased by improving the efficiency of the drive stage when the gain in the final stage is relatively low. However, the linearization of the drive signal output will be affected when the high-efficiency drive amplifier is used as the drive power amplifier 101, so a feedback point is added at the drive signal output. A partial nonlinear drive signal is coupled into a down converter 103 to be down-converted. Then, after being converted into a digital signal by an A/D converter 104, the digital signal is sent to a first DPD correction module 105, in which the digital signal is analyzed. The obtained amplitude and phase of the digital drive signal are pre-distorted, and a signal with nonlinear characteristics contrary to the nonlinear characteristics of the drive signal is output to compensate the nonlinear drive signal output by the drive power amplifier 101. The output signal is then converted by a D/A converter 106 and an up converter 107, and finally is sent back to the drive power amplifier 101, and a drive signal with linearization meeting the requirements is output. Thus, the drive signal may be output linearly even if a high-efficiency drive amplifier is adopted. The drive signal drives a final power amplifier 102, and a partial output amplified signal is coupled into a down converter 103', in which the partial output amplified signal is down-converted. Then, after being converted into a digital signal by an A/D converter 104', the digital signal is sent to a second DPD correction module 105'. Nonlinear compensation is also performed, and the amplified signal with good linearity is output. In this embodiment, by using the existing pre-distortion technology, a feedback loop is disposed in the improved drive power amplifier 101, and the improved drive power amplifier's nonlinear characteristics are corrected through the DPD pre-distortion technology. As such, the efficiency of the drive power amplifier 101 is improved, and the linearity of the drive signal output is ensured, making it possible to obtain a relatively high overall efficiency of the power amplifier when the final power amplifier 102 with a lower gain in the final stage is used.

The DPD pre-distortion technologies adopted in the high-efficiency power amplifier in the embodiments of the present invention include the table lookup method, polynomial method, neural network method and various other pre-distortion methods, in which the table lookup method is relatively simple, and is quite flexible in algorithm, making it a method used widely in the DPD technology. The DPD pre-distortion technology used in the embodiments of the present invention is definitely not limited to the above methods. Any DPD pre-distortion technology that corrects the nonlinear characteristics of the drive signals may be used.

In this embodiment, the drive signal is fed back and the adaptive correction is performed in the DPD correction loop, and this method may improve the linearity of the output signal effectively when a high-efficiency drive amplifier is used.

Figure 2:
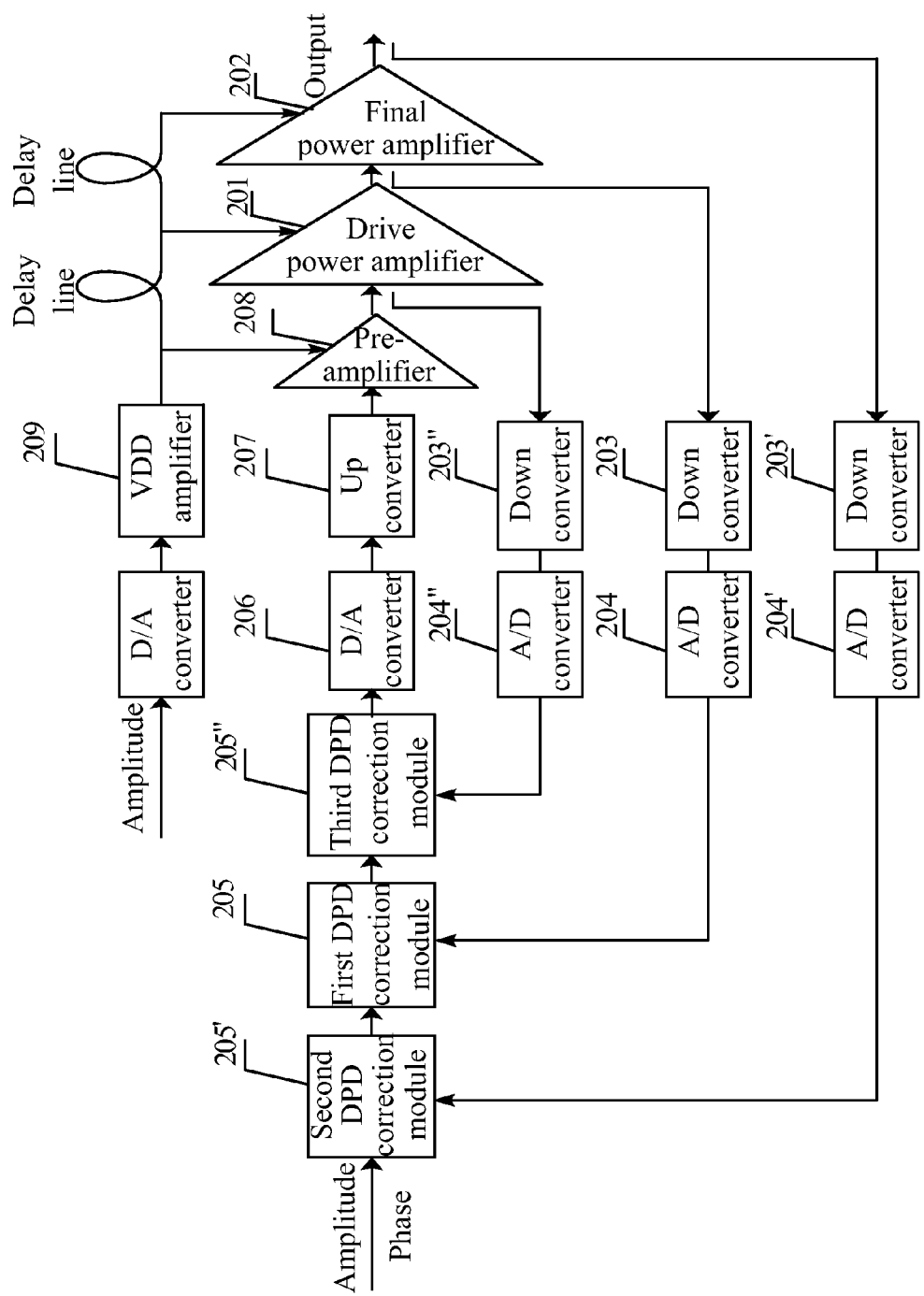
FIG. 2 is a simple schematic structural view of a high-efficiency power amplifier according to another embodiment of the present invention.

FIG. 2 is a simple schematic structural view of a high-efficiency power amplifier according to another embodiment of the present invention. As shown in FIG. 2, the high-efficiency power amplifier includes a drive power amplifier 201, which is a high-efficiency drive amplifier, so as to improve the efficiency of the drive stage, so that the overall efficiency of the power amplifier may be increased by improving the efficiency of the drive stage when the gain in the final stage is relatively low. A feedback point is added at the drive signal output, and a partial nonlinear drive signal is coupled into a down converter 203 to be down-converted. Then, after being converted into a digital signal by an A/D converter 204, the digital signal is sent to a first DPD correction module 205, in which the digital signal is analyzed. The obtained amplitude and phase of the digital nonlinear drive signal is pre-distorted, and a signal with nonlinear characteristics contrary to the nonlinear characteristics of the drive signal is output to compensate the nonlinear drive signal output by the drive power amplifier 201. The output signal then passes a D/A converter 206 and an up converter 207, and finally is sent back to the drive power amplifier 201, and the drive signal with linearization meeting the requirements is output. Thus, the drive signal may be output linearly even if a high-efficiency drive amplifier is adopted. As shown in FIG. 2, after the correction, the drive amplifier outputs the linear drive signal, which is used to drive a final power amplifier 202 (ET or EER power amplifier) with a lower gain in the final stage. Because the final power amplifier 202 outputs nonlinear amplified signal effectively, DPD pre-distortion technology is also needed to correct the signal. As shown in FIG. 2, a feedback point is disposed at the output of the final power amplifier 202. The feedback point is used to connect a corresponding second DPD correction module 205'. The second DPD correction module 205' is communicated with the first DPD correction module 205 in series, and is configured to correct the final power amplifier 202 individually. Before the signal is input into the drive power amplifier 201, a pre-amplifier 208 also may be included, so as to output a pre-amplified signal to the drive power amplifier 201. The pre-amplifier 208 also uses a third DPD correction module 205" to correct its output signal. The drive power amplifier 201, the final power amplifier 202, and the pre-amplifier 208 are all powered by a VDD amplifier 209 carrying an amplitude modulated signal. The VDD amplifier 209 provides variable VDD voltages for the drive power amplifier 201, the final power amplifier 202 and the pre-amplifier 208 according to changes of signal envelopes of the drive power amplifier 201, the final power amplifier 202 and the pre-amplifier 208. Large envelope signals use high VDD voltage, and small envelope signals use low VDD voltage. As such, power consumption is saved when the relatively small envelope signals are amplified, making the power amplifier work effectively all along.

In this embodiment, different DPD correction modules are used to sample output of the amplifier of each stage, including the drive power amplifier 201, the final power amplifier 202 and the pre-amplifier 208, and to perform DPD correction individually. As such, the nonlinear characteristics of the multiple stages of amplifiers will not be accumulated, making accurate DPD correction possible and contributing to the implementation of the high-efficiency power amplifier.

Figure 3:
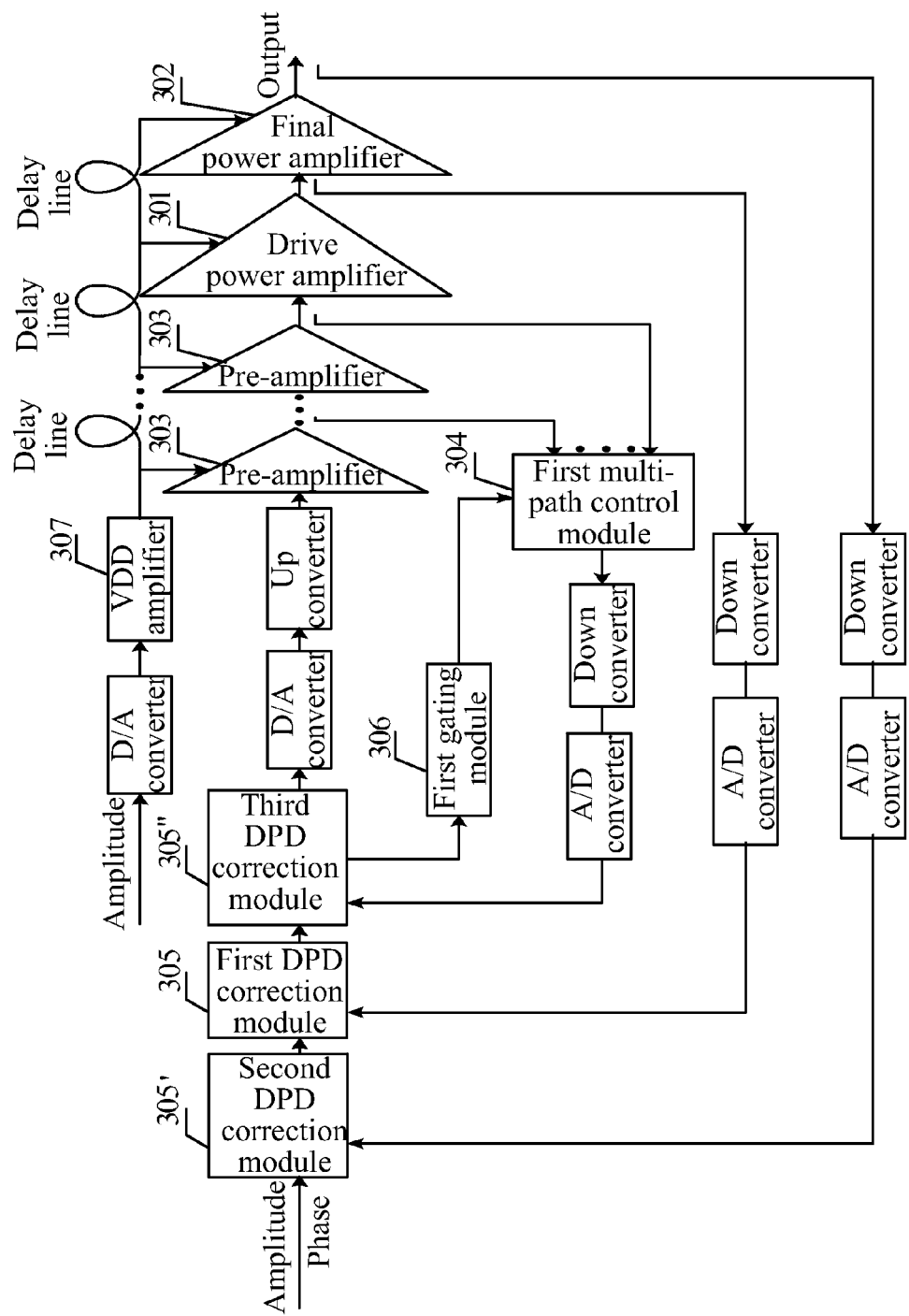
FIG. 3 is a simple schematic structural view of a high-efficiency power amplifier according to another embodiment of the present invention.

FIG. 3 is a schematic structural view of the high-efficiency power amplifier according to another embodiment of the present invention. As shown in FIG. 3, the correction of the drive power amplifier 301 and the final power amplifier 302 is the same as that of the high-efficiency power amplifier according to the above embodiment. In this embodiment, multiple stages of pre-amplifiers 303 are adopted to pre-amplify the signals. The correction of the multiple stages of pre-amplifiers 303 adopts a structure as follows. A first multi-path control module 304 is configured to receive multiple pre-amplified signals with nonlinear characteristics output by the multiple pre-amplifiers 303, and to gate a pre-amplified signal into a third DPD correction module 305" enabled by a first gating module 306 communicated with the third DPD correction module 305". The first gating module 306 is controlled by the third DPD correction module 305", and enables the first multi-path control module 304 to gate a certain pre-amplified signal into the third DPD correction module 305" sequentially. The third DPD correction module 305" pre-distorts the nonlinear characteristics of the pre-amplified signals output by the multiple stages of pre-amplifiers 303. After being pre-distorted, the pre-amplified signal passes the transmission line, and in the end an amplified signal with good linearity is output. The drive power amplifier 301, the final power amplifier 302 and multiple stages of pre-amplifiers 303 are all powered by a VDD amplifier 307 carrying an amplitude modulated signal. The VDD amplifier 307 provides variable VDD voltages for the drive power amplifier 301, the final power amplifier 302 and the pre-amplifiers 303 according to changes of signal envelopes of the drive power amplifier 301, the final power amplifier 302 and the multiple stages of pre-amplifiers 303. Large envelope signals use high VDD voltage, and small envelope signals use low VDD voltage. As such, power consumption is saved when the relatively small envelope signals are amplified, making the power amplifier work effectively all along.

In this embodiment, an individual first DPD correction module 305 is used to correct the drive signal output by the drive power amplifier 301 individually, and an individual second DPD correction module 305' is used to correct the amplified signal output by the final power amplifier 302, so as to ensure better linear compensation and to ensure that the amplifiers output the drive signal and amplified signal with good linearity. A first multi-path control module 304 is used to gate the pre-amplified signal fed back by the sampling point of each of the multiple stages of pre-amplifiers 303, and to gate a certain pre-amplified signal into a third DPD correction module 305" sequentially for correction. As such, one third DPD correction module 305" may correct the nonlinear amplified signals output by all the pre-amplifiers 303, so the volume is reduced, the cost is saved, and the overall efficiency of the power amplifier is improved.

Figure 4:
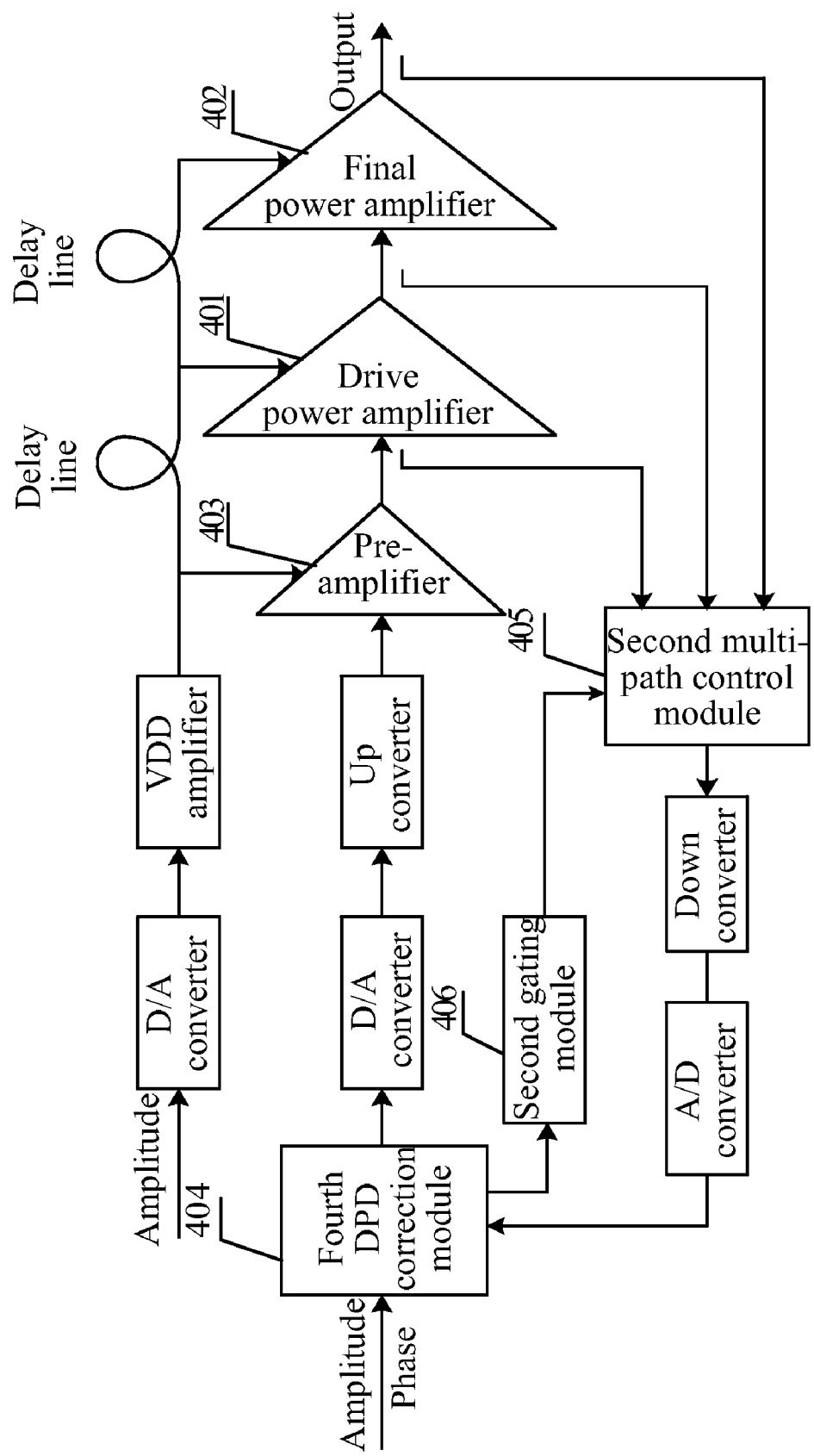
FIG. 4 is a simple schematic structural view of a high-efficiency power amplifier according to another embodiment of the present invention.

FIG. 4 is a schematic structural view of the high-efficiency power amplifier according to another embodiment of the present invention. As shown in FIG. 4, the high-efficiency power amplifier includes a drive power amplifier 401, which is a high-efficiency drive amplifier, so as to improve the efficiency of the drive stage, so that the overall efficiency of the power amplifier may be increased by improving the efficiency of the drive stage when the gain in the final stage of the final power amplifier 402 is relatively low. In this embodiment, a feedback point is added at each of the outputs of a drive power amplifier 401, a final power amplifier 402, and one or more pre-amplifiers. The feedback points are configured to feed back the nonlinear signals to a fourth DPD correction module 404 for correction. The final power amplifier 402 and the drive power amplifier 401 are communicated in series, and the pre-amplifier 403 and the drive power amplifier 401 are communicated in series as well. The second multi-path control module 405 is configured to receive the signals with nonlinear characteristics output by the drive power amplifier 401, the final power amplifier 402 and one or more pre-amplifiers 403, and to gate the drive signal, amplified signal, or pre-amplified signal enabled by a second gating module 406 into the fourth DPD correction module 404. The second gating module 406 is communicated with the fourth DPD correction module 404 and the second multi-path control module 405, and is controlled by the fourth DPD correction module 404. The second gating module 406 controls the second multi-path control module 405 to gate the drive signal, the amplified signal, or one or more pre-amplified signals into the fourth DPD correction module 404. The fourth DPD correction module 404 is configured to pre-distort the nonlinear characteristics of the drive signal output by the drive power amplifier 401, the amplified signal output by the final power amplifier 402, or the pre-amplified signals output by one or more pre-amplifier 403, to output a signal having nonlinear characteristics contrary to the drive signal, the amplified signal or the pre-amplified signal, and to correct the nonlinear characteristics of the drive signal, the amplified signal or the pre-amplified signal.

In this embodiment, the second multi-path control module 405 is used to gate the signal fed back by each of the sampling points of the drive power amplifier 401, the final power amplifier 402 or one or more pre-amplifiers, and to gate the drive signal, the amplified signal or a certain pre-amplified signal into the fourth DPD correction module 404 sequentially. As such, one fourth DPD correction module 404 may correct the nonlinear amplified signals output by the drive power amplifier 401, the final power amplifier 402 and one or more pre-amplifiers, so the volume is reduced, the cost is saved, and the overall efficiency of the power amplifier is improved.

It should be noted that the above embodiments are merely provided for elaborating the technical solutions of the present invention, but not intended to limit the present invention. Although the present invention has been described in detail with reference to the foregoing embodiments, it is apparent that person having ordinary skill in the art may make modifications to the technical solutions described in the above embodiments, or may make some equivalent replacements to some of the technical properties without making the nature of the corresponding technical solutions depart from the spirit and scope of the various embodiments of the invention.

What is claimed is:

1. A high-efficiency power amplifier comprising:
   a drive amplifier;
   a final power amplifier;
   a first digital pre-distortion correction (DPD) module configured to pre-distort nonlinear characteristics of a drive signal output by the drive amplifier, output a first signal having nonlinear characteristics contrary to the nonlinear characteristics of the drive signal, and correct the nonlinear characteristics of the drive signal, wherein the drive signal is output by the drive amplifier for driving the final power amplifier; and
   a second DPD correction module connected to the first DPD correction module in series, and configured to pre-distort nonlinear characteristics of an amplified signal output by the final power amplifier, output a second signal having nonlinear characteristics contrary to the nonlinear characteristics of the amplified signal, and correct the nonlinear characteristics of the amplified signal.

2. The high-efficiency power amplifier according to claim 1, further comprising:
   at least one pre-amplifier connected to the drive amplifier in series; and
   a third DPD correction module connected to the second DPD correction module in series, and configured to pre-distort nonlinear characteristics of a pre-amplified signal output by one of the at least one pre-amplifier, output a third signal having nonlinear characteristics contrary to the nonlinear characteristics of the pre-amplified signal, and correct the nonlinear characteristics of the pre-amplified signal.

3. The high-efficiency power amplifier according to claim 2, wherein the at least one pre-amplifier comprises multiple pre-amplifiers connected in series.

4. The high-efficiency power amplifier according to claim 3, further comprising a first multi-path control module and a first gating module, wherein
   the first multi-path control module is communicated with the third DPD correction module, and configured to receive the multiple pre-amplified signals having the nonlinear characteristics output by the multiple pre-amplifiers, and gate one of the multiple pre-amplified signals into the third DPD correction module under control of the first gating module; and
   the first gating module is configured to control the first multi-path control module to gate one of the multiple pre-amplified signals into the third DPD correction module, wherein the first gating module is connected to the third DPD correction module and the first multi-path control module, and is controlled by the third DPD correction module.

5. The high-efficiency power amplifier according to claim 2, further comprising a voltage amplifier configured to provide drive power signals carrying an amplitude modulated signal for the drive amplifier, the final power amplifier and the pre-amplifier.

6. A high-efficiency power amplifier comprising:
   a drive amplifier;
   a final power amplifier;
   a second multi-path control module;
   a fourth digital pre-distortion (DPD) correction module; and
   a second gating module;
   wherein the second multi-path control module is configured to receive multiple signals to be gated, including a drive signal having nonlinear characteristics output by the drive amplifier and an amplified signal having nonlinear characteristics output by the final power amplifier, and gate one of the drive signal and the amplified signal to output under control of the second gating module;
   wherein the fourth digital pre-distortion (DPD) correction module is configured to pre-distort the nonlinear characteristics of the one of the drive signal and the amplified signal gated by the second multi-path control module, output a signal having nonlinear characteristics contrary to the nonlinear characteristics of the drive signal, and correct the nonlinear characteristics of the drive signal if the drive signal is gated by the second multi-path control module, or output a signal having nonlinear characteristics contrary to the nonlinear characteristics of the amplified signal, and correct the nonlinear characteristics of the amplified signal if the amplified signal is gated by the second multi-path control module; and
   wherein the second gating module is configured to control the multiple signals to be gated by the second multi-path control module, wherein one of the drive signal and the amplified signal is gated into the fourth DPD correction module, wherein the second gating module is connected to the fourth DPD correction module and the second multi-path control module, and is controlled by the fourth DPD correction module.

7. The high-efficiency power amplifier according to claim 6, wherein:
   the second multi-path control module is further connected to at least one pre-amplifier, and the at least one pre-amplifier is configured to output nonlinear pre-amplified signals to the second multi-path control module, and is connected to the drive amplifier in series;
   the second multi-path control module is further configured to receive the nonlinear pre-amplified signals, and gate one of the nonlinear pre-amplified signals to output under control of the second gating module; and
   the fourth digital pre-distortion (DPD) correction module is further configured to pre-distort the nonlinear characteristics of the one of the nonlinear pre-amplified signals gated by the second multi-path control module, output a signal having nonlinear characteristics contrary to the nonlinear characteristics of the one of the nonlinear pre-amplified signals, and correct the nonlinear characteristics of the one of the nonlinear pre-amplified signals.

8. The high-efficiency power amplifier according to claim 7, further comprising a voltage amplifier configured to provide drive power signals carrying an amplitude modulated signal for the drive amplifier, the final power amplifier and the pre-amplifier.

9. A method for amplifying power comprising:
pre-distorting nonlinear characteristics of a drive signal output by a drive amplifier, outputting a first signal having nonlinear characteristics contrary to the nonlinear characteristics of the drive signal, and correcting the nonlinear characteristics of the drive signal, wherein the drive signal is output by the drive amplifier for driving a final power amplifier; and
pre-distorting nonlinear characteristics of an amplified signal output by the final power amplifier, outputting a second signal having nonlinear characteristics contrary to the nonlinear characteristics of the amplified signal, and correcting the nonlinear characteristics of the amplified signal.

10. The method for amplifying power according to claim 9, further comprising:
pre-distorting nonlinear characteristics of a pre-amplified signal output by one of at least one pre-amplifier, outputting a third signal having nonlinear characteristics contrary to the nonlinear characteristics of the pre-amplified signal, and correcting the nonlinear characteristics of the pre-amplified signal.

11. The method for amplifying power according to claim 10, wherein the at least one pre-amplifier comprises multiple pre-amplifiers, and the multiple pre-amplifiers are connected in series; the method further comprising:
receiving multiple pre-amplified signals having the nonlinear characteristics output by the multiple pre-amplifiers, and gating one of the multiple pre-amplified signals to be pre-distorted.

12. The method for amplifying power according to claim 10, further comprising:
providing drive power signals carrying an amplitude modulated signal for the drive amplifier, the final power amplifier and the at least one pre-amplifier.

13. The method for amplifying power according to claim 9, further comprising:
receiving multiple signals to be gated, including the drive signal having nonlinear characteristics output by the drive amplifier and the amplified signal having nonlinear characteristics output by the final power amplifier, gating one of the drive signal and the amplified signal to output, and pre-distorting the nonlinear characteristics of the one of the drive signal and the amplified signal.

14. The method for amplifying power according to claim 10, further comprising:
receiving multiple signals to be gated, including the drive signal having nonlinear characteristics output by the drive amplifier, the amplified signal having nonlinear characteristics output by the final power amplifier and the pre-amplified signal having nonlinear characteristics output by the one of the at least one pre-amplifier, gating one of the drive signal, the amplified signal and the pre-amplified signal to output, and pre-distorting the nonlinear characteristics of the one of the drive signal, the amplified signal and the pre-amplified signal.

15. The method for amplifying power according to claim 11, further comprising:
receiving multiple signals to be gated, including the drive signal having nonlinear characteristics output by the drive amplifier, the amplified signal having nonlinear characteristics output by the final power amplifier and the multiple pre-amplified signals having nonlinear characteristics output by the multiple pre-amplifiers, gating one of the drive signal, the amplified signal and the multiple pre-amplified signals to output, and pre-distorting the nonlinear characteristics of the one of the drive signal, the amplified signal and the multiple pre-amplified signals.

* * * * *